(12) United States Patent
Chen et al.

(10) Patent No.: US 10,806,256 B1
(45) Date of Patent: Oct. 20, 2020

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/580,074

(22) Filed: Sep. 24, 2019

(30) Foreign Application Priority Data

May 15, 2019 (TW) .............................. 108117032 A (51) Int. Cl.
| | |
|---|---|
| *F16C 29/04* | (2006.01) |
| *A47B 88/493* | (2017.01) |
| *H05K 7/18* | (2006.01) |
| *A47B 88/477* | (2017.01) |
| *A47B 88/483* | (2017.01) |

(52) U.S. Cl.
CPC .......... *A47B 88/493* (2017.01); *A47B 88/477* (2017.01); *A47B 88/483* (2017.01); *H05K 7/183* (2013.01)

(58) Field of Classification Search
CPC ... A47B 88/477; A47B 88/487; A47B 88/493; F16C 29/004; F16C 29/005; F16C 29/046; F16C 29/048
See application file for complete search history.

(56) References Cited

U.S. PATENT DOCUMENTS

| | | | |
|---|---|---|---|
| 6,948,691 B2 | 9/2005 | Brock et al. | |
| 7,404,611 B1 * | 7/2008 | Que | A47B 88/493 312/333 |
| 9,328,769 B1 | 5/2016 | Chen et al. | |
| 9,504,181 B2 | 11/2016 | Chen et al. | |
| 9,545,153 B2 * | 1/2017 | Chen | H05K 7/1489 |
| 9,848,702 B2 | 12/2017 | Chen et al. | |
| 2013/0259411 A1 | 10/2013 | Judge | |

(Continued)

FOREIGN PATENT DOCUMENTS

EP     3094165 A1    11/2016

OTHER PUBLICATIONS

Search Report in a Counterpart Application Issued by a Foreign Patent Office.

*Primary Examiner* — Phillip A Johnson
(74) *Attorney, Agent, or Firm* — Rosenberg, Klein & Lee (57) ABSTRACT

A slide rail assembly includes a first rail, a second rail, and a bracket device. The second rail can be displaced with respect to the first rail. The bracket device is adjacent to the first rail and includes a bracket with an upper wall, a lower wall, a sidewall, and a first and a second extension section. The sidewall is connected between the upper and the lower walls. The first and the second extension sections extend from and are bent with respect to the upper and the lower walls respectively. The first rail is partially enclosed in a support channel defined by the upper wall, the lower wall, the sidewall, and the extension sections of the bracket.

17 Claims, 6 Drawing Sheets

(56) References Cited

U.S. PATENT DOCUMENTS

| | | | |
|---|---|---|---|
| 2014/0265786 A1* | 9/2014 | Chen | H05K 7/1489 312/334.1 |
| 2017/0095078 A1* | 4/2017 | Chen | A47B 88/43 |
| 2018/0087572 A1* | 3/2018 | Chen | A47B 88/497 |
| 2018/0168349 A1 | 6/2018 | Chen et al. | |

* cited by examiner

SLIDE RAIL ASSEMBLY

FIELD OF THE INVENTION

The present invention relates to a slide rail and more particularly to a slide rail assembly with high structural strength reliability.

BACKGROUND OF THE INVENTION

U.S. Pat. No. 6,948,691 B2 discloses a computer server mounting apparatus that includes a stationary portion (i.e., a stationary rail) and a telescoping portion (i.e., a movable rail) as shown in FIG. 1 and FIG. 1A accompanying the specification of the US patent. The stationary portion has two ends each provided with a bracket, and each bracket has a first wall and a second wall. The first wall of each bracket is parallel to the stationary portion (i.e., the stationary rail) and has a slot through which a threaded fastener extends so that the bracket can be longitudinally adjusted (i.e., displaced) with respect to the stationary portion (i.e., the stationary rail). Moreover, as shown in FIG. 2 of the US patent, the second wall of each bracket is provided with a plurality of mounting hooks configured to be mounted in the corresponding apertures of a rack structure (i.e., a rack post) respectively.

It can be seen in FIG. 1 of the US patent that the first wall of each bracket is parallel to the longitudinal wall of the stationary portion (i.e., the stationary rail) and is connected to the stationary portion (i.e., the stationary rail) by a threaded fastener that extends through a slot in the first wall. The brackets disclosed in the US patent, therefore, do not provide effective support for the stationary portion (i.e., the stationary rail) in areas other than the longitudinal wall of the stationary portion (i.e., the stationary rail).

Figures 1, 2:
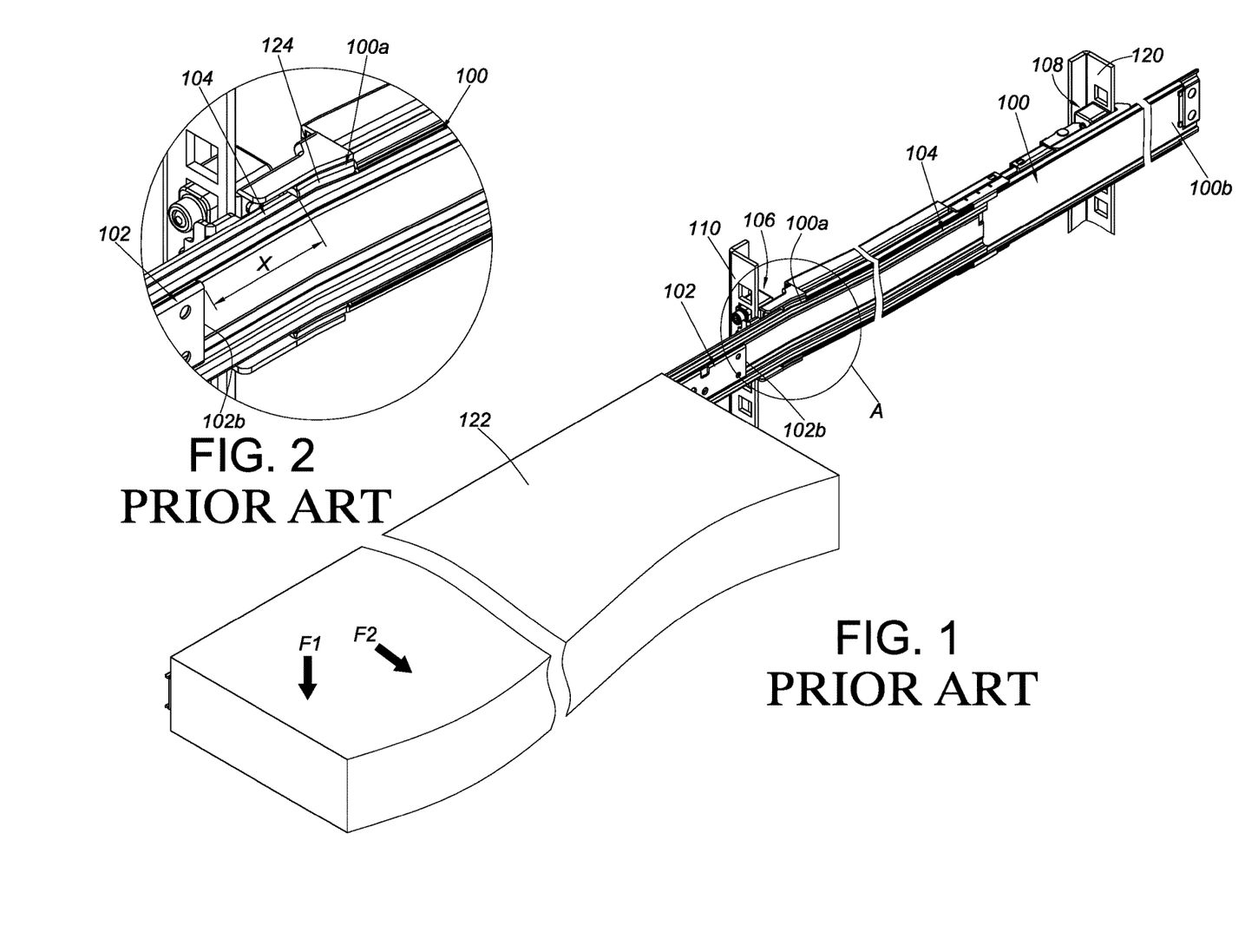
FIG. 1 is a perspective view of a conventional slide rail assembly that is applied to a rack and carries an object.
FIG. 2 is an enlarged view of the circled area A in FIG. 1.

FIG. 1 and FIG. 2 accompanying the present specification show a conventional slide rail assembly in an extended position in which a portion of the slide rail assembly is deformed. The slide rail assembly includes a first rail 100, a second rail 102, and a third rail 104. A front end portion 100a and a rear end portion 100b of the first rail 100 are mounted on a first post 110 and a second post 120 of a rack through a first bracket device 106 and a second bracket device 108 respectively. The third rail 104 is movably mounted between the first rail 100 and the second rail 102 to increase the distance for which the second rail 102 can be longitudinally displaced with respect to the first rail 100. The second rail 102 is configured to carry an object 122 (e.g., a piece of electronic equipment or a drawer).

To meet the demand for quality, it is sometimes required to test the structural strength of a slide rail assembly. Take the conventional slide rail assembly in FIG. 1 and FIG. 2 for example. An external force (e.g., a first force F1 and/or a second force F2) may be applied to a slide rail (e.g., the second rail 102) of the slide rail assembly in different directions to find out if any other slide rail (e.g., the first rail 100) will twist or deform in a lateral, or transverse, direction and form a bend 124. The external force may twist or deform the first rail 100 or the third rail 104 of the slide rail assembly laterally, in particular when the slide rail assembly is in an overextended position, e.g., when the rear end 102b of the second rail 102 is a distance X ahead of the front end portion 100a of the first rail 100.

It is therefore an important issue to develop slide rail products with reliable structural strength.

SUMMARY OF THE INVENTION

The present invention provides a slide rail assembly that has high structural strength.

According to one aspect of the present invention, a slide rail assembly includes a first rail, a second rail, and a first bracket device. The first rail includes a first wall, a second wall, and a longitudinal wall connected between the first wall and the second wall. The second rail can be displaced with respect to the first rail. The first bracket device is disposed adjacent to the first rail and includes a bracket. The bracket includes an upper wall, a lower wall, a sidewall, a first extension section, and a second extension section. The sidewall is connected between the upper wall and the lower wall. The first extension section extends from and is bent with respect to the upper wall, whereas the second extension section extends from and is bent with respect to the lower wall. The upper wall, the lower wall, and the sidewall of the bracket correspond in position to the first wall, the second wall, and the longitudinal wall of the first rail respectively. The first extension section and the second extension section of the bracket are configured to produce a retaining effect on a lateral side of the first wall of the first rail and a lateral side of the second wall of the first rail respectively.

Preferably, the slide rail assembly further includes a third rail movably mounted between the first rail and the second rail.

Preferably, the first rail has an end portion, and the first bracket device is disposed adjacent to that end portion of the first rail.

Preferably, the slide rail assembly further includes a second bracket device disposed adjacent to the first rail but away from the aforesaid end portion of the first rail.

Preferably, the first wall, the second wall, and the longitudinal wall of the first rail jointly define a channel, and the third rail is mounted in the channel Preferably, the slide rail assembly further includes a first blocking member disposed in a first hole of the first rail and a second blocking member disposed in a second hole of the first rail. Preferably, one of the sidewall and the upper wall of the bracket covers the first hole, and one of the sidewall and the lower wall of the bracket covers the second hole.

Preferably, the slide rail assembly further includes a first ball-based slide-assisting device and a second ball-based slide-assisting device, both disposed in the channel of the first rail to help displace the third rail with respect to the first rail, and the third rail includes a third blocking member and a fourth blocking member. Preferably, the first ball-based slide-assisting device includes a front end and a rear end, which correspond in position to the first blocking member and the third blocking member respectively, and the second ball-based slide-assisting device includes a front end and a rear end, which correspond in position to the second blocking member and the fourth blocking member respectively.

Preferably, the third rail includes a first wall, a second wall, and a longitudinal wall connected between the first wall and the second wall of the third rail, with the third blocking member disposed on the first wall of the third rail, and the fourth blocking member disposed on the second wall of the third rail.

Preferably, the first wall, the second wall, and the longitudinal wall of the third rail jointly define a second channel, and the second rail is mounted in the second channel.

Preferably, the first extension section of the bracket is bent substantially perpendicularly with respect to the upper wall, and the second extension section of the bracket is bent substantially perpendicularly with respect to the lower wall.

Preferably, the bracket further includes an end wall and at least one mounting member. The end wall is bent substantially perpendicularly with respect to the sidewall. The at least one mounting member is disposed at the end wall and is configured to be mounted on a first post. The second bracket device, on the other hand, is configured to be mounted on a second post.

Preferably, the first rail has a front end portion and a rear end portion, and the second rail also has a front end portion and a rear end portion. When the second rail is at an extended position with respect to the first rail, the rear end portion of the second rail is a predetermined distance in front of the front end portion of the first rail.

Preferably, the first bracket device is disposed adjacent to the front end portion of the first rail, and the second bracket device is disposed adjacent to the rear end portion of the first rail.

Preferably, the upper wall, the lower wall, the sidewall, the first extension section, and the second extension section of the bracket jointly define a support channel, and the first wall, the second wall, and the longitudinal wall of the first rail are partially enclosed in the support channel of the bracket.

DETAILED DESCRIPTION OF THE INVENTION

Figure 3:
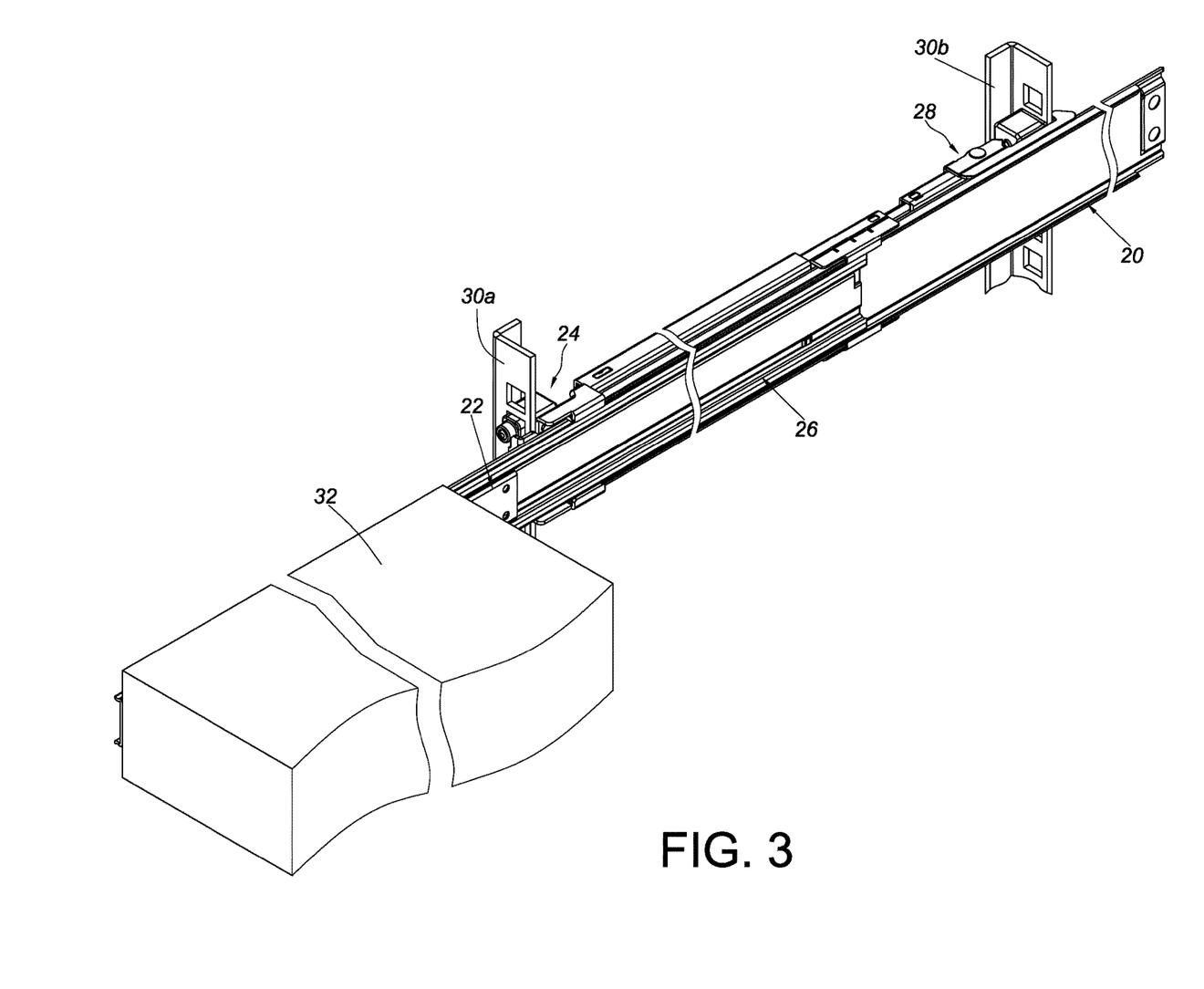
FIG. 3 is a perspective view of the slide rail assembly according to an embodiment of the present invention, wherein the slide rail assembly is applied to a rack and carries an object.

Referring to FIG. 3, the slide rail assembly according to an embodiment of the present invention includes a first rail 20, a second rail 22, and a first bracket device 24. Preferably, the slide rail assembly further includes a third rail 26 and a second bracket device 28.

The first rail 20 is mounted on a first post 30a and a second post 30b of a rack through the first bracket device 24 and the second bracket device 28 respectively. The third rail 26 is movably mounted between the first rail 20 and the second rail 22 to increase the distance for which the second rail 22 can be displaced with respect to the first rail 20. The second rail 22 is configured to carry an object 32 (e.g., a piece of electronic equipment or a drawer).

Figure 4:
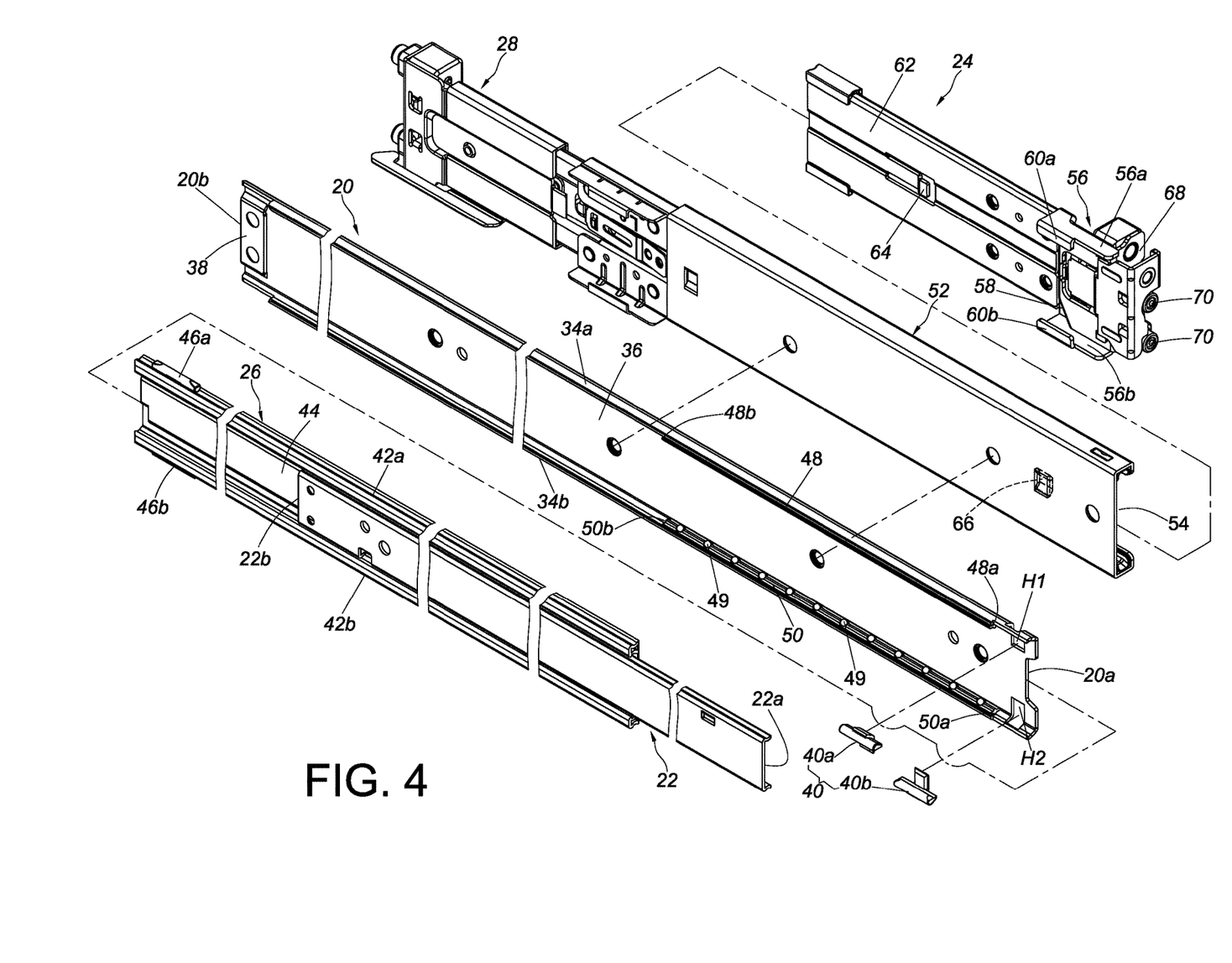
FIG. 4 is an exploded perspective view of the slide rail assembly according to the embodiment of the present invention.
Figure 5:
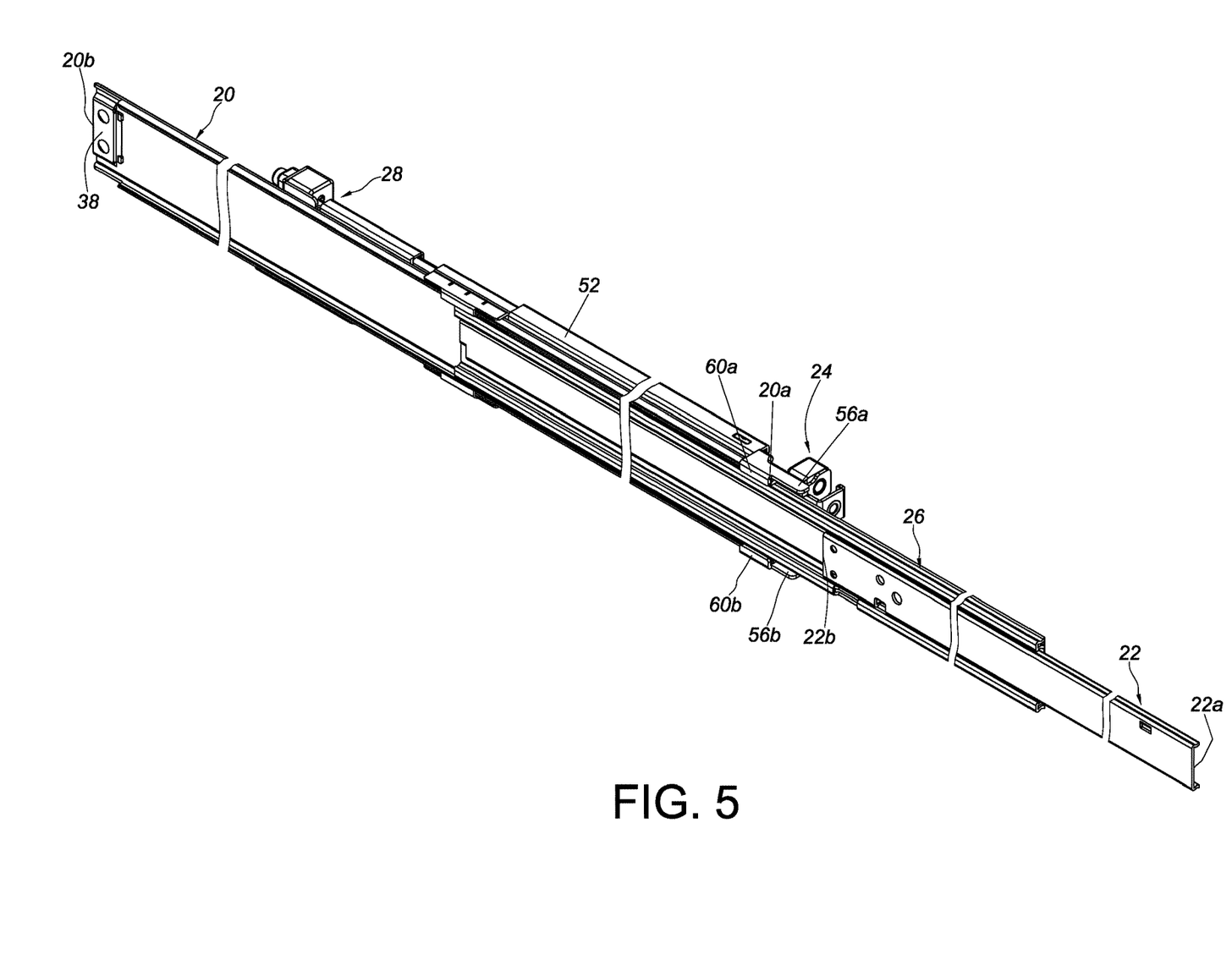
FIG. 5 is an assembled perspective view of the slide rail assembly according to the embodiment of the present invention.

As shown in FIG. 4 and FIG. 5, the first rail 20 (e.g., the outer rail) has a front end portion 20a and a rear end portion 20b. The first rail 20 includes a first wall 34a, a second wall 34b, and a longitudinal wall 36 connected between the first wall 34a and the second wall 34b of the first rail 20. The first wall 34a, the second wall 34b, and the longitudinal wall 36 of the first rail 20 jointly define a first channel, in which the third rail 26 is mounted. Preferably, a rear blocking structure 38 and a front blocking structure 40 are disposed adjacent to the rear end portion 20b and the front end portion 20a of the first rail 20 respectively to limit the range within which the third rail 26 can be longitudinally displaced with respect to the first rail 20. More specifically, the rear blocking structure 38 is, for example, a projection protruding from the longitudinal wall 36 of the first rail 20, and the front blocking structure 40 includes a first blocking member 40a and a second blocking member 40b by way of example. The first blocking member 40a is disposed in a first hole H1 of the first wall 34a and/or the longitudinal wall 36 of the first rail 20, and the second blocking member 40b is disposed in a second hole H2 of the second wall 34b and/or the longitudinal wall 36 of the first rail 20. Preferably, both the first blocking member 40a and the second blocking member 40b are projections and protrude from the longitudinal wall 36 of the first rail 20, and the first blocking member 40a and the second blocking member 40b are respectively received and fixed in the first hole H1 and the second hole H2.

The third rail 26 (e.g., the middle rail) includes a first wall 42a, a second wall 42b, and a longitudinal wall 44 connected between the first wall 42a and the second wall 42b of the third rail 26. The first wall 42a, the second wall 42b, and the longitudinal wall 44 of the third rail 26 jointly define a second channel, in which the second rail 22 is mounted. Preferably, the third rail 26 includes a third blocking member 46a and a fourth blocking member 46b. Preferably, the third blocking member 46a is disposed on the first wall 42a of the third rail 26, and the fourth blocking member 46b is disposed on the second wall 42b of the third rail 26. Preferably, both the third blocking member 46a and the fourth blocking member 46b are projections and are adjacent to a rear end portion of the third rail 26.

Preferably, the slide rail assembly further includes a first ball-based slide-assisting device 48 and a second ball-based slide-assisting device 50, both disposed in the first channel of the first rail 20 to increase the smoothness of displacement of the third rail 26 with respect to the first rail 20. The second ball-based slide-assisting device 50 includes a plurality of balls 49 supported between the second wall 42b of the third rail 26 and the second wall 34b of the first rail 20. The first ball-based slide-assisting device 48 includes a plurality of balls 51 supported between the first wall 42a of the third rail 26 and the first wall 34a of the first rail 20 (see FIG. 6).

It is preferable that the first ball-based slide-assisting device 48 includes a front end 48a and a rear end 48b, that the front end 48a and the rear end 48b of the first ball-based slide-assisting device 48 correspond in position to the first blocking member 40a and the third blocking member 46a respectively, that the second ball-based slide-assisting device 50 includes a front end 50a and a rear end 50b, and that the front end 50a and the rear end 50b of the second ball-based slide-assisting device 50 correspond in position to the second blocking member 40b and the fourth blocking member 46b respectively.

The second rail 22 (e.g., the inner rail) can be displaced with respect to the first rail 20 via the third rail 26. The second rail 22 has a front end portion 22a and a rear end portion 22b.

The first bracket device 24 is disposed adjacent to the first rail 20, e.g., adjacent to the front end portion 20a of the first rail 20. Preferably, the slide rail assembly further includes a reinforcing base 52 connected (e.g., fixedly connected) to the backside of the first rail 20 (i.e., the opposite side of the first channel). Preferably, the reinforcing base 52 includes a mounting channel 54, and the first bracket device 24 includes a bracket 56, wherein the bracket 56 includes an upper wall 56a, a lower wall 56b, a sidewall 58, a first extension section 60a, and a second extension section 60b.

The sidewall 58 is connected between the upper wall 56a and the lower wall 56b. The first extension section 60a extends from and is bent with respect to the upper wall 56a, and the second extension section 60b extends from and is bent with respect to the lower wall 56b.

Preferably, one of the sidewall 58 and the upper wall 56a (e.g., the upper wall 56a) of the bracket 56 is configured to cover the first hole H1 in the first wall 34a of the first rail 20, and one of the sidewall 58 and the lower wall 56b (e.g., the lower wall 56b) of the bracket 56 is configured to cover the second hole H2 in the second wall 34b of the first rail 20. Thus, with the first rail 20 having the first hole H1 and the second hole H2, each of the upper wall 56a and the lower wall 56b of the bracket 56 helps the corresponding one of the first wall 34a and the second wall 34b of the first rail 20 to support the third rail 26 and/or the second rail 22 with greater strength.

Preferably, the bracket 56 further includes an extension support member 62 connected to the sidewall 58 and is mounted in the mounting channel 54 of the reinforcing base 52 via the extension support member 62. Preferably, the extension support member 62 and the reinforcing base 52 have a first position-limiting feature 64 and a second position-limiting feature 66 respectively, and the two position-limiting features correspond to each other in position. For example, the second position-limiting feature 66 is a projection for blocking the first position-limiting feature 64. Preferably, the bracket 56 further includes an end wall 68 and at least one mounting member 70. The end wall 68 is bent with respect to the sidewall 58 in a substantially perpendicular manner. The at least one mounting member 70 is disposed at the end wall 68.

The second bracket device 28 is disposed adjacent to the first rail 20 but away from the front end portion 20a of the first rail 20. For example, the second bracket device 28 is disposed adjacent to the rear end portion 20b of the first rail 20 through the reinforcing base 52. The second bracket device 28 preferably has substantially the same structural configuration as the first bracket device 24 and, for the sake of brevity therefore, will not be described any further.

Figure 6:
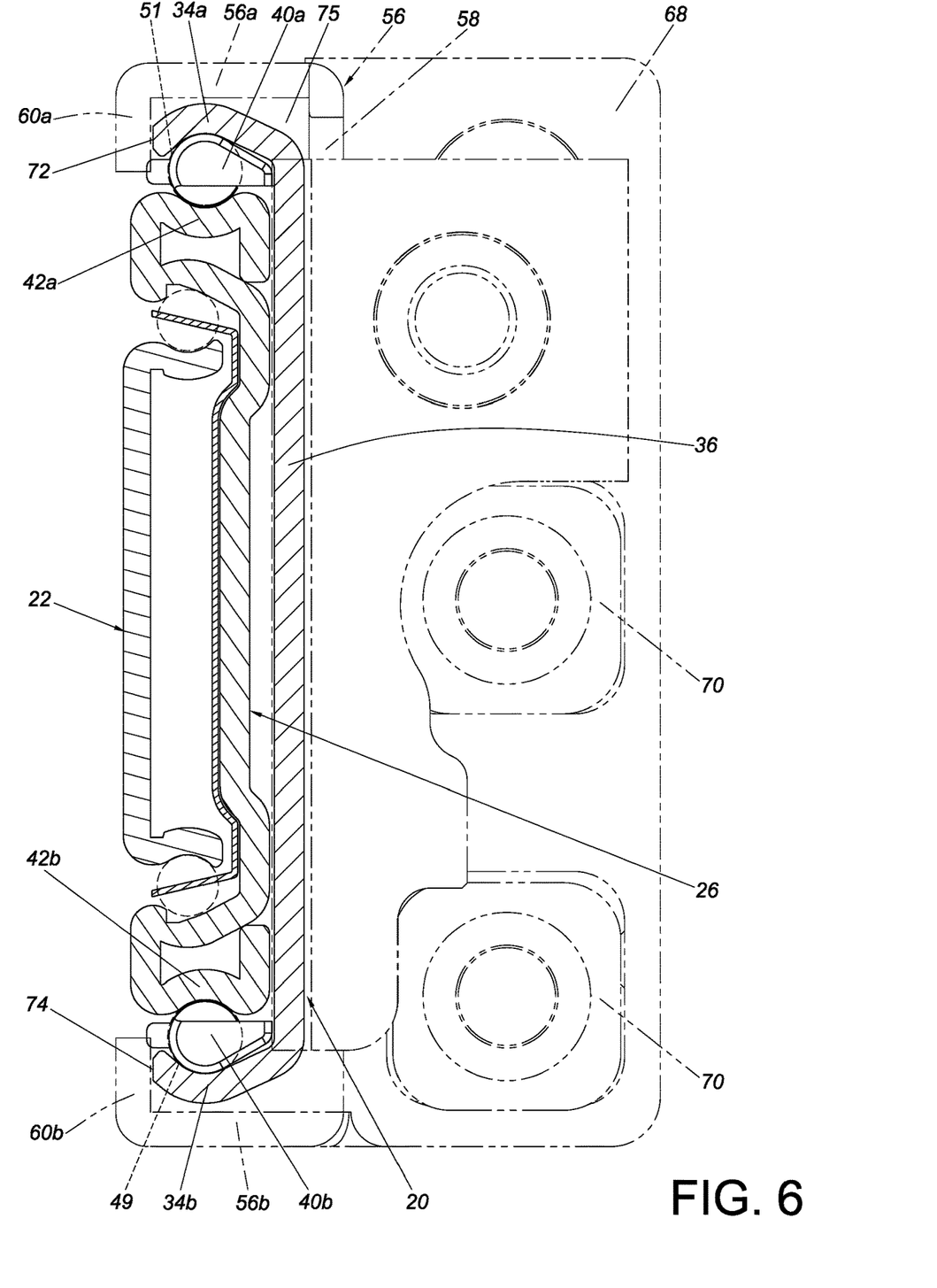
FIG. 6 is sectional view of the slide rail assembly according to the embodiment of the present invention.

As shown in FIG. 6, the upper wall 56a, the lower wall 56b, and the sidewall 58 of the bracket 56 correspond in position to the first wall 34a, the second wall 34b, and the longitudinal wall 36 of the first rail 20 respectively, and the first extension section 60a and the second extension section 60b of the bracket 56 are adjacent to and configured to produce a retaining effect on (or are merely adjacent to) a lateral side 72 of the first wall 34a of the first rail 20 and a lateral side 74 of the second wall 34b of the first rail 20 respectively. More specifically, the upper wall 56a, the lower wall 56b, the sidewall 58, the first extension section 60a, and the second extension section 60b of the bracket 56 jointly define a support channel 75, and the first wall 34a, the second wall 34b, and the longitudinal wall 36 of the first rail 20 are partially enclosed in the support channel 75 of the bracket 56. In other words, the bracket 56 encloses a portion of the first wall 34a, second wall 34b, and longitudinal wall 36 of the first rail 20. This configuration allows the bracket 56 to effectively support, and increase the structural strength of, the first rail 20, lest the first rail 20 be twisted or deformed in a lateral (or transverse) direction by an external force.

Preferably, the first extension section 60a extends from the upper wall 56a and is bent with respect to the upper wall 56a in a first direction (e.g., a downward direction), and the second extension section 60b extends from the lower wall 56b and is bent with respect to the lower wall 56b in a second direction (e.g., an upward direction). Preferably, the first direction and the second direction are opposite directions. Preferably, the first extension section 60a of the bracket 56 is bent substantially perpendicularly with respect to the upper wall 56a, and the second extension section 60b of the bracket 56 is bent substantially perpendicularly with respect to the lower wall 56b.

Figures 7, 8:
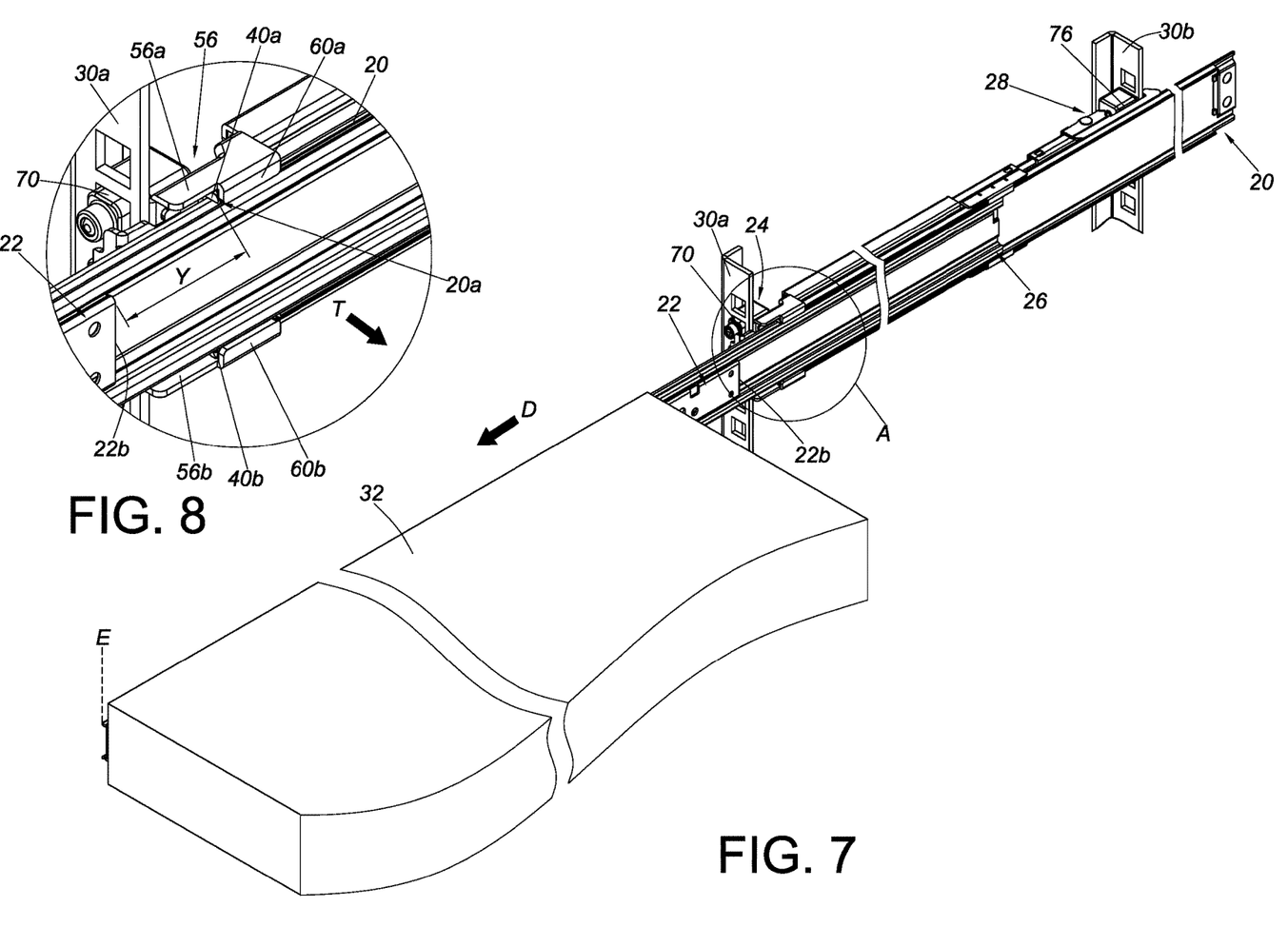
FIG. 7 is a schematic view showing that the slide rail assembly is applied to the rack and carries the object according to the embodiment of the present invention.
FIG. 8 is an enlarged view of the circled area A in FIG. 7.

In FIG. 7 and FIG. 8, the first rail 20 of the slide rail assembly is mounted on the first post 30a via the at least one mounting member 70 of the first bracket device 24 and is mounted on the second post 30b via the at least one mounting member 76 of the second bracket device 28, and the slide rail assembly is in an extended state.

When the second rail 22 carries the object 32 or when an external force is applied to the second rail 22, the first extension section 60a and the second extension section 60b of the bracket 56 produce a retaining effect on the lateral side 72 of the first wall 34a of the first rail 20 and the lateral side 74 of the second wall 34b of the first rail 20 respectively (see also FIG. 6), thereby protecting the first rail 20 from damage attributable to deformation or bending in a lateral direction (e.g., in the transverse direction T in FIG. 8). A comparison between FIGS. 7 and 8 and FIGS. 1 and 2 reveals that the first extension section 60a and the second extension section 60b of the bracket 56 in FIG. 8 can be used to prevent lateral twisting or deformation of the first rail 100 and/or the third rail 104 of the conventional slide rail assembly in FIG. 2.

With continued reference to FIG. 7 and FIG. 8, the rear end portion 22b of the second rail 22 is a predetermined distance Y ahead of the front end portion 20a of the first rail 20 when the second rail 22 reaches an extended position E after longitudinal displacement with respect to the first rail 20 in an opening direction D. Now that the bracket 56 partially encloses the first wall 34a, the second wall 34b, and the longitudinal wall 36 of the first rail 20 (see FIG. 6) and thus effectively increases the supporting strength of the first rail 20 in this state, the object 32 (or an external force) is kept from twisting or deforming the first rail 20 in a lateral direction.

It can be known from the above that the foregoing embodiment of the present invention preferably has the following features:

1. The first extension section 60a and the second extension section 60b of the bracket 56 are adjacent to and can produce a retaining effect on the lateral side 72 of the first wall 34a of the first rail 20 and the lateral side 74 of the second wall 34b of the first rail 20 respectively, thereby increasing the structural strength, and preventing lateral deformation, of the first rail 20.

2. When the second rail 22 arrives at the extended position E (where the rear end portion 22b of the second rail 22 is a predetermined distance Y in front of the front end portion 20a of the first rail 20), the first wall 34a, the second wall 34b, and the longitudinal wall 36 of the first rail 20 are partially enclosed in the support channel 75 defined jointly by the upper wall 56a, the lower wall 56b, the sidewall 58, the first extension section 60a, and the second extension section 60b of the bracket 56, in order for the bracket 56 to support, and increase the structural strength of, the first rail 20 and protect the first rail 20 from being twisted or deformed in a lateral direction by an external force.

While the present invention has been disclosed through the preferred embodiment described above, the embodiment is not intended to be restrictive of the scope of the invention. The scope of patent protection sought by the applicant is defined by the appended claims.

What is claimed is:

1. A slide rail assembly, comprising:
a first rail including an end portion, a first wall, a second wall, and a longitudinal wall connected between the first wall and the second wall;
a second rail displaceable with respect to the first rail;
a third rail movably mounted between the first rail and the second rail; and
a first bracket device disposed adjacent to the end portion of the first rail and including a bracket, wherein the bracket includes an upper wall, a lower wall, a sidewall, a first extension section, and a second extension section, the sidewall is connected between the upper wall and the lower wall, the first extension section extends from and is bent with respect to the upper wall, and the second extension section extends from and is bent with respect to the lower wall;
wherein the upper wall, the lower wall, and the sidewall of the bracket correspond in position to the first wall, the second wall, and the longitudinal wall of the first rail respectively, and the first extension section and the second extension section of the bracket are configured to produce a retaining effect on a lateral side of the first wall of the first rail and a lateral side of the second wall of the first rail respectively;
wherein the first wall, the second wall, and the longitudinal wall of the first rail jointly define a channel, the third rail is mounted in the channel, the slide rail assembly further comprises a first blocking member and a second blocking member disposed respectively in a first hole and a second hole of the first rail, one of the sidewall and the upper wall of the bracket covers the first hole, and one of the sidewall and the lower wall of the bracket covers the second hole.

2. The slide rail assembly of claim 1, further comprising a second bracket device disposed adjacent to the first rail but away from the end portion of the first rail.

3. The slide rail assembly of claim 1, further comprising a first ball-based slide-assisting device and a second ball-based slide-assisting device, both disposed in the channel of the first rail to facilitate displacement of the third rail with respect to the first rail, wherein the third rail includes a third blocking member and a fourth blocking member, the first ball-based slide-assisting device includes a front end and a rear end, the front end and the rear end of the first ball-based slide-assisting device correspond in position to the first blocking member and the third blocking member respectively, the second ball-based slide-assisting device includes a front end and a rear end, and the front end and the rear end of the second ball-based slide-assisting device correspond in position to the second blocking member and the fourth blocking member respectively.

4. The slide rail assembly of claim 3, wherein the third rail includes a first wall, a second wall, and a longitudinal wall connected between the first wall and the second wall of the third rail, the third blocking member is disposed on the first wall of the third rail, and the fourth blocking member is disposed on the second wall of the third rail.

5. The slide rail assembly of claim 4, wherein the first wall, the second wall, and the longitudinal wall of the third rail jointly define a second channel, and the second rail is mounted in the second channel.

6. The slide rail assembly of claim 1, wherein the first extension section of the bracket is bent substantially perpendicularly with respect to the upper wall, and the second extension section of the bracket is bent substantially perpendicularly with respect to the lower wall.

7. The slide rail assembly of claim 1, further comprising a reinforcing base connected to a backside of the first rail, wherein the reinforcing base includes a mounting channel, the bracket further includes an extension support member connected to the sidewall and is mounted in the mounting channel of the reinforcing base via the extension support member, the extension support member and the reinforcing base have a first position-limiting feature and a second position-limiting feature respectively, and the first position-limiting feature and the second position-limiting feature correspond in position to each other.

8. A slide rail assembly, comprising:
a first rail having a front end portion and a rear end portion, the first rail including a first wall, a second wall, and a longitudinal wall connected between the first wall and the second wall;
a second rail having a front end portion and a rear end portion;
a third rail movably mounted between the first rail and the second rail, wherein when the second rail is at an extended position with respect to the first rail, the rear end portion of the second rail is a predetermined distance ahead of the front end portion of the first rail; and
a first bracket device disposed adjacent to the front end portion of the first rail and including a bracket, wherein the bracket includes an upper wall, a lower wall, a sidewall, a first extension section, and a second extension section, the sidewall is connected between the upper wall and the lower wall, the first extension section extends from the upper wall and is bent with respect to the upper wall in a first direction, the second extension section extends from the lower wall and is bent with respect to the lower wall in a second direction, and the first direction and the second direction are opposite directions;
wherein the upper wall, the lower wall, and the sidewall of the bracket correspond in position to the first wall, the second wall, and the longitudinal wall of the first rail respectively, and the first extension section and the second extension section of the bracket are adjacent to a lateral side of the first wall of the first rail and a lateral side of the second wall of the first rail respectively.

9. The slide rail assembly of claim 8, wherein the first bracket device is disposed adjacent to the front end portion of the first rail.

10. The slide rail assembly of claim 9, further comprising a second bracket device disposed adjacent to the rear end portion of the first rail.

11. The slide rail assembly of claim 9, wherein the first wall, the second wall, and the longitudinal wall of the first rail jointly define a channel, the third rail is mounted in the channel, the slide rail assembly further comprises a first blocking member and a second blocking member disposed respectively in a first hole and a second hole of the first rail, one of the sidewall and the upper wall of the bracket covers the first hole, and one of the sidewall and the lower wall of the bracket covers the second hole.

12. The slide rail assembly of claim 11, further comprising a first ball-based slide-assisting device and a second ball-based slide-assisting device, both disposed in the channel of the first rail to facilitate displacement of the third rail with respect to the first rail, wherein the third rail includes a third blocking member and a fourth blocking member, the first ball-based slide-assisting device includes a front end and a rear end, the front end and the rear end of the first ball-based slide-assisting device correspond in position to the first blocking member and the third blocking member respectively, the second ball-based slide-assisting device includes a front end and a rear end, and the front end and the rear end of the second ball-based slide-assisting device correspond in position to the second blocking member and the fourth blocking member respectively.

13. The slide rail assembly of claim 12, wherein the third rail includes a first wall, a second wall, and a longitudinal wall connected between the first wall and the second wall of the third rail, the third blocking member is disposed on the first wall of the third rail, and the fourth blocking member is disposed on the second wall of the third rail.

14. The slide rail assembly of claim 13, wherein the first wall, the second wall, and the longitudinal wall of the third rail jointly define a second channel, and the second rail is mounted in the second channel.

15. The slide rail assembly of claim 8, wherein the first extension section of the bracket is bent substantially perpendicularly with respect to the upper wall, and the second extension section of the bracket is bent substantially perpendicularly with respect to the lower wall.

16. A slide rail assembly, comprising:
   a first rail including a first wall, a second wall, and a longitudinal wall connected between the first wall and the second wall;
   a second rail displaceable with respect to the first rail;
   a first bracket device disposed adjacent to the first rail and including a bracket, wherein the bracket includes an upper wall, a lower wall, a sidewall, a first extension section, and a second extension section, the sidewall is connected between the upper wall and the lower wall, the first extension section extends from and is bent with respect to the upper wall, and the second extension section extends from and is bent with respect to the lower wall; and
   a reinforcing base connected to a backside of the first rail, wherein the reinforcing base includes a mounting channel, the bracket further includes an extension support member connected to the sidewall and is mounted in the mounting channel of the reinforcing base via the extension support member, the extension support member and the reinforcing base have a first position-limiting feature and a second position-limiting feature respectively, and the first position-limiting feature and the second position-limiting feature correspond in position to each other;
   wherein the upper wall, the lower wall, the sidewall, the first extension section, and the second extension section of the bracket jointly define a support channel, and the first wall, the second wall, and the longitudinal wall of the first rail are partially enclosed in the support channel of the bracket.

17. The slide rail assembly of claim 16, further comprising a third rail movably mounted between the first rail and the second rail, wherein the first rail has an end portion, the first bracket device is disposed adjacent to the end portion of the first rail, the slide rail assembly further comprises a second bracket device disposed adjacent to the first rail but away from the end portion of the first rail, the first extension section of the bracket is bent substantially perpendicularly with respect to the upper wall, and the second extension section of the bracket is bent substantially perpendicularly with respect to the lower wall.

* * * * *